(12) United States Patent
Wong (10) Patent No.: US 6,918,172 B2
(45) Date of Patent: Jul. 19, 2005

(54) PROCESS FOR MANUFACTURING NB3SN SUPERCONDUCTOR

(75) Inventor: James Wong, Wayland, MA (US)

(73) Assignee: Composite Materials Technology, Inc., Shrewsbury, MA (US)

( * ) Notice: Subject to any disclaimer, the term of this patent is extended or adjusted under 35 U.S.C. 154(b) by 457 days.

(21) Appl. No.: 10/037,935

(22) Filed: Jan. 2, 2002

(65) Prior Publication Data

US 2002/0194724 A1 Dec. 26, 2002

Related U.S. Application Data (63) Continuation-in-part of application No. 09/753,200, filed on Jan. 2, 2001, now abandoned, which is a continuation-in-part of application No. 09/532,362, filed on Mar. 21, 2000, now Pat. No. 6,543,123.

(51) Int. Cl.$^7$ ............................................. H01L 39/24
(52) U.S. Cl. ....................... 29/599; 148/98; 174/125.1; 505/100; 505/230; 505/231; 505/232
(58) Field of Search .............................. 29/599; 148/98; 174/125.1; 505/100, 230, 231, 232

(56) References Cited

U.S. PATENT DOCUMENTS

| | | | | |
|---|---|---|---|---|
| 4,224,087 A | * | 9/1980 | Tachikawa et al. | 148/98 |
| 4,746,581 A | * | 5/1988 | Flukiger | 428/614 |
| 4,767,470 A | * | 8/1988 | Tachikawa et al. | 148/98 |
| 4,776,899 A | * | 10/1988 | Murase et al. | 148/98 |
| 5,299,728 A | * | 4/1994 | King et al. | 228/179.1 |
| 5,505,790 A | * | 4/1996 | Benz et al. | 148/98 |
| 5,541,787 A | * | 7/1996 | Jabbari et al. | 360/97.01 |
| 5,869,169 A | * | 2/1999 | Jones | 428/213 |

FOREIGN PATENT DOCUMENTS

| JP | 03-208279 | * | 9/1991 |
|---|---|---|---|

OTHER PUBLICATIONS

Sakamoto et al, 37 Very High Critical Current Density of Bronze–Processed (Nb, Ti)Sn Superconducting Wire IEEE Transactions on Applied Superconductivity, vol. 10, No. 1, Mar. 2000, pp. 971–974.*

Rumaner et al. Effect of Oxygen and Zirconium on the Growth and Superconing Properties of Nb3Sn, Metallurgical and Materials Transactions, vol. 25A, Jan. 1994, pp 203–211.*

Naus et al The Interdiffusion of Cu and Sn in Internal Sn Nb3Sn Superconductors, IEEE Transactions ASC, vol. 10, No. 1, pp983–987.*

Caslaw , J.S. "The Influence of Liquid Metal Infiltration on Superconducting Characteristics of Niobium Nitride", Advances in Cryogenic Eng., vol. 34, pp 835–847, 1987.*

Tachikawa, K., Developmentsof A15 Elementary Composite Superconductors in Japan by Masaki Suenaga and Alan F. Clark, Plenum Press, NY, Cryogenic Mat. Series 1980, pp 1–15.*

Katagiri et al. "Tensile Strain/Transverse Compressive Stress Effects in Nb3Sn Multifilimentary Wires with CuNb Reinforcing Stabilizer" Adbvances in Cryogenic Eng., vol. 42, Plenum Press, NY, pp 1423–1432.*

Dew–Hughes et al "Treatise on Material Science and technology", vol. 14, Metallurgy of Superconducting Materials, 1979, pp 429–432.*

Valder, B. "Niobium Alloy C–103/Aerospace Applications" Wah Chang, Outlook $1^{st}$ Quarter 2000.*

* cited by examiner

*Primary Examiner*—Carl J. Arbes
(74) *Attorney, Agent, or Firm*—Hayes Soloway P.C.

(57) ABSTRACT

A niobium-based superconductor is manufactured by establishing multiple niobium components in a billet of a ductile metal, working the composite billet through a series of reduction steps to form the niobium components into elongated elements, each niobium element having a thickness on the order of 1 to 25 microns, surrounding the billet prior to the last reduction step with a porous confining layer of an acid resistant metal, immersing the confined billet in an acid or a high temperature liquid metal to remove the ductile metal from between the niobium elements while the niobium elements remain confined by said porous layer, exposing the confined mass of niobium elements to a material capable of reacting with Nb to form a superconductor.

22 Claims, 10 Drawing Sheets

Table 1

| Ex. | Sample No. | Amount of Hf added to Nb(%) | Amount of elements in the Cu-base alloy (%) | | | Thickness of the Nb₃Sn layer (μm) | Critical current density at 4.2°K and 15 T (× 10⁴ A/cm²) | Transition temperature (K.°) |
|---|---|---|---|---|---|---|---|---|
| | | | Sr | Ga | Al | | | |
| 1 | 1 | 5 | 7 | — | — | 24 | 7.3 | 17.6 |
| | 2 | 5 | 5 | 4 | — | 17 | 10.2 | 17.6 |
| | 3 | 5 | 6 | — | 2 | 27 | 7.6 | 17.5 |
| | 4 | — | 7 | — | — | 12 | 1.1 | 17.3 |
| 2 | 5 | 3 | 5 | 4 | — | 8 | 3.6 | 17.5 |
| | 6 | 3 | 7 | — | — | 19 | 5.5 | 17.5 |
| | 7 | 3 | 5 | 4 | — | 13 | 8.5 | 17.5 |
| | 8 | 7 | 7 | — | — | 28 | 7.4 | 17.6 |
| | 9 | 7 | 6 | — | 2 | 30 | 7.9 | 17.6 |
| 3 | 10 | 5 | 3 | 9 | 1 | 10 | 12.5 | 17.7 |
| | 11 | 5 | 5 | 4 | 3 | 18 | 10.8 | 17.6 |

PROCESS FOR MANUFACTURING NB3SN SUPERCONDUCTOR

RELATED APPLICATIONS

This application is a continuation in part of my applications Ser. Nos. 09/532,362 filed Mar. 21, 2000 now U.S. Pat. No. 6,543,123, and 09/753,200 filed Jan. 2, 2001 now abandoned. The subject matter of said prior patent applications is included herein in its entirety.

TECHNICAL FIELD

The present invention pertains to the fabrication of A-15 type multifilament composite superconductors (By "A-15" is meant the intermetallic compounds having βW structure). These include $Nb_3Sn$, and $Nb_3Al$ and are important because of their superior high field properties. Unfortunately, they are brittle compounds, difficult to make as fine filaments and as a result are very expensive. For these reasons, ductile NbTi superconductors have dominated the commercial market even though their maximum magnetic field are limited to less than 8 Tesla. Significant improvements are needed in order to commercialize the A-15 conductors and to extend the useful magnetic fields to the 12 Tesla range on a cost effective basis. The present invention is also applicable to the production of the "B1" superconductors NbN and NbC.

Standard Industrial Practice

A detailed description of present day methods currently being used in the industry is described in an article entitled "A-15 Superconductors" in the Metals Handbook, Tenth Edition, Volume 2 on pages 1060–1077, authored by David B. Smathers. Two processes are currently being used. One employs a bronze alloy as the matrix, the other a combination of pure copper and a pure Sn core. The first is known as the "Bronze Process" and the latter the "Internal Tin Process". The bronze matrix contains up to 13 wt % Sn, work hardens rapidly and requires frequent annealing steps. These anneals are avoided with the internal tin process. However, the cold drawing in the Internal Tin process can result in poor bonding, degraded filament quality and poor yields. After final drawing and twisting, both types of conductors are heated to approximately 700° C. for 200 hours or more to form $Nb_3Sn$. Magnets are made exclusively by the Wind and React method.

The current densities that are obtained are substantially below what is theoretically possible based on experimental short sample data. Contributing to this problem is the low reaction temp of up to 700° C., requiring hundreds of hours of reaction heat treatment. As the Sn is depleted, the Sn gradient is reduced which further limits the reaction. Unreacted Nb in the Nb filament can be left and Kirkendall type voids are formed in the residual matrix resulting in a lowering of the current density and mechanical properties of the conductor.

Significant improvements are needed to improve the high field performance and to reduce the cost of these important A-15 conductors.

BACKGROUND ART

In the fabrication of $Nb_3Sn$ superconducting wire, a barrier, usually tantalum or a tantalum alloy is employed to prevent tin contamination of the stabilizing copper on the exterior of the wire during heat treatment. The process is described in the article by David B. Smathers. While the porous metal sheath described in the present invention is similar to the barrier used in $Nb_3Sn$ conductor fabrication, application of the technology in this invention is entirely unique.

Fiber Production

In my earlier U.S. Pat. Nos. 5,034,857 and 5,869,196, I disclose a novel approach to the production of very fine valve metal filaments, preferable tantalum, for capacitor use. The benefits of fine filaments relative to fine powders are higher purity, lower cost, uniformity of cross section, and ease of dielectric infiltration, while still maintaining high surface area for anodization. The uniformity of cross section results in capacitors with high specific capacitance, lower ESR and ESL, and less sensitivity to forming voltage and sintering temperature as compared to fine powder compacts. Other patents involving valve metal filaments and fibers, their fabrication, or articles made therefrom include U.S. Pat. Nos. 3,277,564, 3,379,000 (Webber), U.S. Pat. No. 3,394,213 (Roberts), U.S. Pat. No. 3,567,407 (Yoblin), 3,698,863 (Roberts) U.S. Pat. No. 3,742,369 (Douglass), U.S. Pat. Nos. 4,502,884, 5,306,462 and 5,245,514 (Fife).

PRIOR ART

The prior art relating to the fabrication of A-15 conductors can be obtained by reading both Smather's article and "Filamentary A-15 Superconductors" by Masaki Suenaga and Alan F. Clark, Plenum Press, N.Y. Cryogenic Material Series (published 1980). In this book, the article by C. H. Rosner, B. A. Zeitlin, R. CX. Schwall, M. S. Walker and G. M. Ozeryansky entitled "Review of Superconducting Activities at IGC on A-15 Conductors" pages 67–79, specifically summarizes the earlier developments. Initially, powder metallurgy methods were employed followed soon by surface diffusion of liquid Sn of both Nb tapes and wires. Allen U.S. Pat. No. 3,218,693 describes a method where Sn coated Nb ribbons and wire were reacted to form $Nb_3Sn$ at temperatures between 800° C. to 1000° C. Similar products were also made by General Electric and later by IGC. The Nb wires in cable form, were Sn dipped, wound into a magnet and reacted; D. F. Martin et al U.S. Pat. No. 3,429,032. A subsequent article, by Scanlan and Fietz, "MultiFilamentary $Nb_3Sn$ for Superconducting Generator application", IEEE Trans. MAG-11 page 287, March 1975, describes fabrication of a $Nb_3Sn$ cable employing electroplated Sn as the Sn source.

BRIEF SUMMARY OF THE INVENTION

A new approach is necessary to improve the processing of $Nb_3Sn$ conductors. In the early 1960's, pure Nb tapes, wires and cable were dipped in molten Sn baths which was then reacted at high temperatures to form $Nb_3Sn$. Because $Nb_3Sn$ is brittle, a ductile substrate of unreacted Nb was left to permit handling and subsequent winding into magnets. However, the need for stable, fine filaments and twisted conductors soon made this method obsolete.

My earlier U.S. Pat. No. 5,896,196 describes a process used to manufacture Ta capacitors where Ta multifilaments are made in a constraining sheath. This process describes the removal of the copper matrix after the final forming operation. The advantages of the external sheath is that final packaging of the filaments are unnecessary since the filaments are now constrained and supported by the outer sheath. Furthermore, the area inside the sheath is exactly determined as is the volume fraction of Ta.

A precursor wire, containing fine Nb filaments enclosed in a constraining sheath which can act as a supporting structure is produced. Upon the removal of the copper matrix, and employing a liquid Sn dipping process, Sn or a CuSn alloy is used to infiltrate and surround the Nb filaments. The significant advantage here is that the need for subsequent wire drawing is completely eliminated as is the co-processing and low yield difficulties of present day $Nb_3Sn$ conductors. The ability to easily increase the Sn concentration can result in substantial improvement in current density over present day conductors. The sheath, in the preferred embodiments, is made of Nb although Ta and stainless steel could also be used. The sheath is fabricated by methods as described in my aforesaid U.S. Pat. No. 5,869, 196. The billet is processed in the normal manner by extrusion and wire drawing to the final size. The copper matrix is then removed from this precursor wire and replaced with a Sn or CuSn alloy matrix. Final reaction heat treatments are then used to convert the Nb to $Nb_3Sn$.

In an alternative embodiment, the original copper matrix is removed from the confined billet by immersing the confined billet in a molten bath of a displacing metal at elevated temperature. The metal, which should be an alloying metal with copper, preferably comprises tin, aluminum, or an alloy of tin or aluminum, and should be heated to a temperature in the range of about 700 to 1400° C., preferably about 1000 to 1200° C., more preferably about 1100° C. The high temperature metal bath essentially instantaneously dissolves the copper matrix and replaces the copper matrix with itself. In a preferred embodiment, a high temperature copper-tin alloy bath is employed in place of the pure tin, and replaces the copper with a copper/tin alloy.

BRIEF DESCRIPTION OF THE DRAWINGS

FIG. 1 is a schematic depiction of the primary billet used in the present invention, FIG. 1a showing a transverse cross section, and FIG. 1b showing a cutaway view revealing the longitudinal disposition of the billet components.

FIG. 3 is a schematic depiction of the product of the preferred embodiment of the present invention, FIG. 3a showing the product as a cylindrical body, and FIG. 3b showing the product after shaping into a rectangular body.

DETAILED DESCRIPTION OF THE INVENTION

Figure 2:
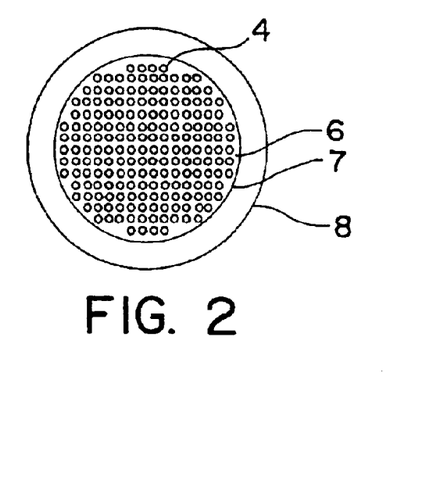
FIG. 2 is a schematic depiction of the transverse cross section of the secondary billet used in the process of the present invention.
Figure 3A:
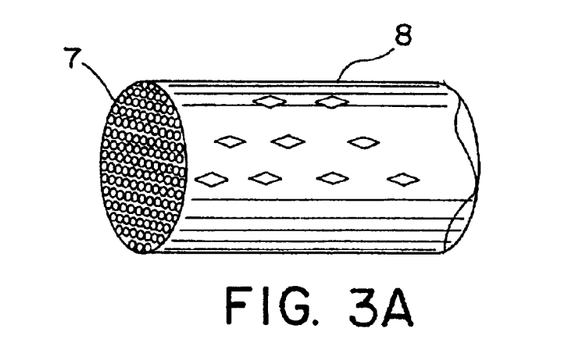
Figure 3B:
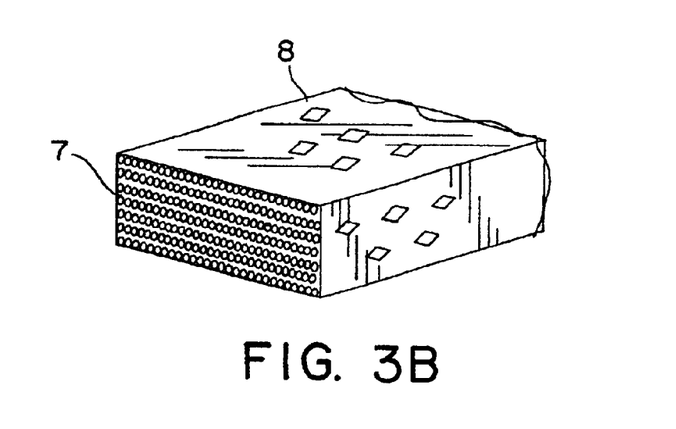

This invention is directed to the fabrication of the fine metal filaments for use as the base for reaction with tin (for example) to produce A-15 superconductors in situ. A very small body of constrained filaments and a method for manufacture are disclosed. The invention will be of greatest value in the superconductor industry, which seeks to develop increasingly high magnetic field A-15 superconductors. The metal is selected from among the metallic elements, niobium and in particular, the A-15 compounds of Nb. In a preferred form, the product of the present invention, the metal filaments are of a diameter less than 50 microns. They are constrained within a cylindrical sheath, also made of metal, which has a wall thickness of 100 microns or less. The metal that forms the sheath is preferably the same as that of the filaments, but it is not necessarily so; tantalum can be used as well as stainless steel. Multifilament conductors suitable for use as superconductors are formed through the reduction of a metal billet consisting of multiple filaments of an appropriate refractory metal, preferably niobium, contained within, and spaced apart by, a ductile metal, preferably copper. The Nb filaments are elongated and substantially parallel within the billet as shown in FIG. 2. The array of Nb filaments 4 within the billet is surrounded by a confining layer of metal 7. This metal 7 is preferably, but not necessarily, the same as that which forms the filaments. The metal layer 7 preferably completely surrounds the Nb filament array 4 circumferentially and runs the full length of the filaments. The layer is separated from the filament array 4 by the same ductile metal 6 (e.g. Cu) that serves to separate the filaments 4 from each other. This same ductile metal 6 can also form the surface of the billet, preventing exposure of the confining metal layer during heating etc. The billet is reduced by conventional means, such as extrusion and wire drawing. The confining metal sheath 7 is then perforated (as shown in FIGS. 3a and 3b at 8) such that, in the case of one embodiment of the invention, the mineral acid can readily diffuse through the porous layer and remove the ductile copper separating the Nb filaments. It is important that these perforations 8 should be designed such that the sheath retains its ability to restrain and support the loose Nb filaments 4. More importantly, they should not substantially weaken the strength or ductility of the entire composite. Preferably, the perforations 8 can be accomplished by mechanically rolling the wire in a rolling mill with the desired perforation pattern in a continuous matter. Other means can be also employed, such as selective chemical etching, laser drilling, etc. as would be apparent to one skilled in the art. The constraining metal must be one that is inert to the acid used to dissolve the copper.

Figure 4:
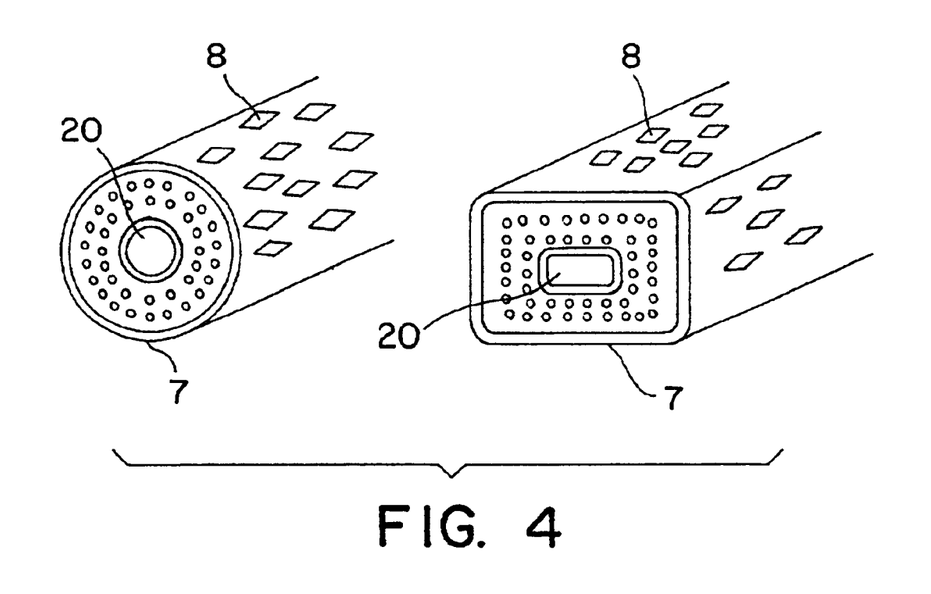
FIG. 4 is similar to FIG. 3 but shows the internal copper core to achieve stabilization.

Typical shapes would be a circular FIG. 3a or rectangular cross section FIG. 3b. An advantage for the rectangular shape is that the distance for the acid to penetrate for complete copper removal is reduced. Internal copper stabilization can be introduced as shown in FIG. 4. The Ta clad copper appears as a central core with a Ta diffusion barrier layer and it also reduces the leaching time. Thereafter, the copper-free confined bundle of Nb filaments is infiltrated with liquid Sn or CuSn alloy to thoroughly coat and embed each Nb filament in a solid Sn or CuSn alloy matrix. The Sn is then reacted with Nb to form $Nb_3Sn$ in a separate step. Temperatures between 700° C. to 1100° C. are used, both performed in an inert atmosphere or vacuum chamber. The Nb-filaments may be reacted partially, completely or it can be completed at a later stage in the manufacture, e.g. after cabling or winding in a magnet.

In one preferred form of the invention, the Nb filaments, at the completion of the mechanical reduction step, will have a diameter on the order of one to twenty-five microns. In this preferred final form of the composite, the Nb filaments are separated by the Cu matrix and the Nb—Cu structure is surrounded by a 50 micron or less thick layer of Nb having an effective porosity of 50% or less. When this composite is immersed in an acid leaching bath of $HNO_3$ and $H_2O$ at 100° C., the copper is removed in about 60 min, leaving a bundle of micron size Nb filaments confined by a porous Nb sheath. When this copper-free mass of Nb filaments is immersed in a Sn alloy bath between 700° C. to 1100° C. the surface tension of the molten Sn bath and the capillarity of the bundle of Nb filaments enclosed within the sheath draws the tin into the bundle where it completely surrounds each Nb filament. The Sn is then reacted with the Nb to form the $Nb_3Sn$ compound at a later stage of manufacturing.

As will be apparent to one skilled in the field of metallurgy, this porosity can be achieved, for example, by mechanically perforating the confining layer wherein the perforations 8 are uniformly spaced about 0.25 mm apart with a diamond shape size of 0.13 mm×0.25 mm, as shown in FIGS. 3a and 3b.

When the acid leaching of the copper from the Nb—Cu matrix results in unacceptably high amounts of surface contamination on the Nb filaments, these contaminates can be removed by the techniques described on page 9, lines 38–55, in my earlier U.S. Pat. No. 5,869,169. Such deoxidation treatments may improve the wetting of the Nb filaments by the liquid Sn alloy as well.

Prior to copper removal, multiple strands of wire can be cabled together and compacted if required. This would avoid any mechanical damage to the Nb filaments because, in this condition, the wire with the Cu matrix is in its most ductile state. The completed cable can then be leached and Sn infiltrated.

The conductor of Example I contains within the niobium sheath 65.1% copper by volume. High percentage of copper, i.e., greater spacing between Nb filaments, would permit a more rapid rate of copper removal by chemical etching but would also lower the current density of the conductor. To maximize the current density, the etched conductor can be mechanically compacted to increase the overall volume fraction of Nb before infiltration.

The infiltration step is performed in a continuous fashion similar to that used for Sn dipped Nb tapes. The resident time in the Sn bath should be as short as possible, only long enough to allow the wire to reach temperature and to permit the Sn to completely infiltrate and embed the filaments. This also avoids any early brittle $Nb_3Sn$ formation and the potential damage that can result from further processing such as cabling, etc.

Approximately 2 wt % Nb is soluble in liquid Sn at 1000° C. Extended time in liquid Sn baths at these temps can result in some Nb loss. Because of this, the time for the infiltration should be very short. In addition, this can largely be avoided by saturating the Sn prior to infiltration by addition of pure Nb metal to the bath. This can be done for example by slowly running ribbons or wires of pure Nb through the process first. At temperatures below 950° C., other non-superconducting compounds can form rapidly. For these reasons the dipping temperatures should be at least 1000° C. and above. It is also important that the wire be cooled rapidly after infiltration to avoid the formation of large grain size brittle intermetallic compounds of Cu and Sn. Large copper additions to the Sn bath and its effects on $Nb_3Sn$ layer growth has been reported by J. S. Caslaw, Cryogenic, February 1971, pp. 51–59. The presence of Cu "catalyze" the $Nb_3Sn$ reaction and improves the surface of the $Nb_3Sn$. Addition of up to 32 wt % Cu resulted in substantial increase in $J_c$.

The Hc2 and Tc values of $Nb_3Sn$ are influenced by the Nb alloy composition. It is well known that selective additions of Ti and Ta can increase these values. It's important to not only increase Hc2 and Tc but also the $J_c$ properties through proper flux pinning mechanisms. Smathers and Swenaga's articles give detailed explanation of "Flux pinning" and the methods currently employed. All of these methods can be applied in this invention. Besides pure Nb, alloys of Nb-1 wt % Zr, Nb-1.5 wt % Ti, and Nb-7.5 wt % Ta can be used. The alloys can also be mechanically added to the Nb by wrapping alternating thin layers of either Ta, Ti, Zr, or Hf between the Nb layers in a Jelly Roll fashion. The Ta, Ti, Zr, or Hf can also be in the form of an open mesh design. A single thin layer can also be used on the surface of the Nb filament. This would help to reduce the possibility of bridging between filaments. The Sn bath would include, in addition to copper, smaller amounts of Ti, Mg, Al, Zr, and Ga as well. The Ta and Ti can also be added to the Nb by means of a thin surface layer of expanded Ta or Ti mesh. The Sn bath could include in addition to Cu, smaller amounts of Mg and Ti.

The most important parameter determining the performance of $Nb_3Sn$ conductors is its current density. In the field of High Energy Physic, accelerator magnets capable of operating in excess of 12 Tesla at 4.2°K are needed. The dipole magnets for the Large Hardon Collider accelerator being constructed at CERN can only operate at less than 10 Tesla at 1.9°K using NbTi. For $Nb_3Sn$, the highest $J_c$ values are currently being made by the Internal Sn process and values as high as 2070 A/mm² at 12 Tesla and 4.2°K have been reported. The bronze process appears to be limited to below 1,000 A/mm² and is thus not a factor. Values as high as 3,000 A/mm² are needed for the next generation of accelerator magnets.

The area within the diffusion barrier contains only three components; Nb, Cu and Sn. Increasing $J_c$ can only be obtained by increase in the volume fraction of Nb. This requires a proportional reduction in copper which increases the Sn to Cu ratio. Copper simply acts as a carrier for the Sn; it does not by itself participate directly toward increasing $J_c$. It does however perform a vital function; that is to allow the successful co-processing of both the bronze and Internal Sn $Nb_3Sn$ conductors. Intensive efforts directed over the past two decades toward optimizing the Nb:Cu:Sn ratios has all but reached its limits due to the concomitant decrease in its fabricability as the Sn fraction is increased. In the present invention, no such limitation exists. The matrix alloy can be varied between pure Sn to pure Cu. Fabricability is not an issue since the conductor is made initially with a pure copper matrix.

While the preferred method of application of the constraining sheath has been described, it is recognized that alternatively, the sheath can be separately applied to a finished copper niobium multi-filaments wire by mechanical means. Several additional techniques may be employed as shown in FIGS. 5 through 9.

Figure 5:
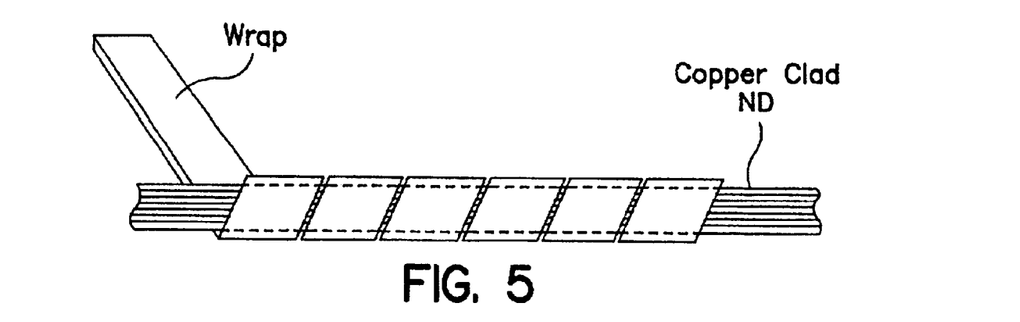
FIGS. 5–9 show additional systems for constraining the niobium filaments during and after the step of acid leaching of the copper.

In FIG. 5, the constraining layer is spirally wrapped around the Cu—Nb composite with adequate spacing between the spirals to allow access by the leaching acid.

Figure 6:
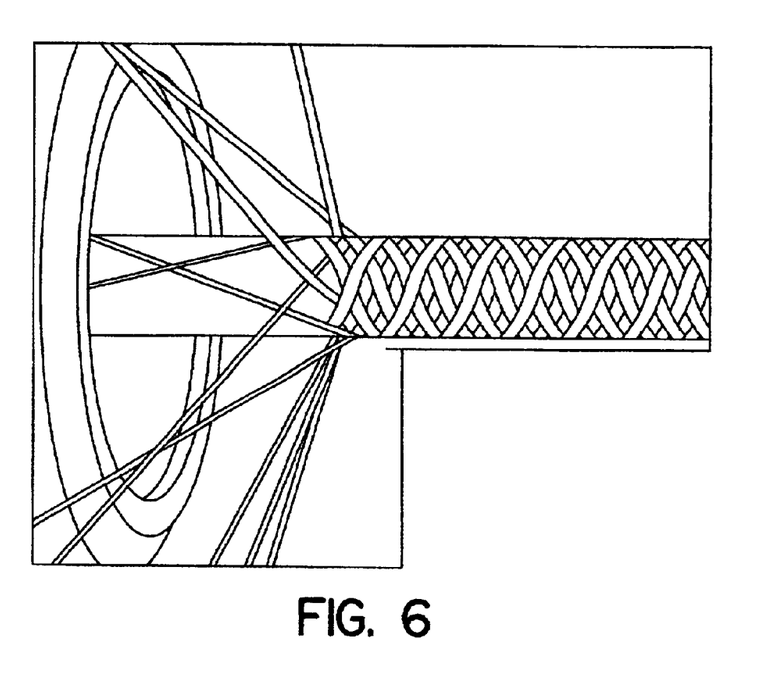

In FIG. 6, the constraining layer is woven in a braid around the Cu—Nb composite with an open weave.

Figure 7:
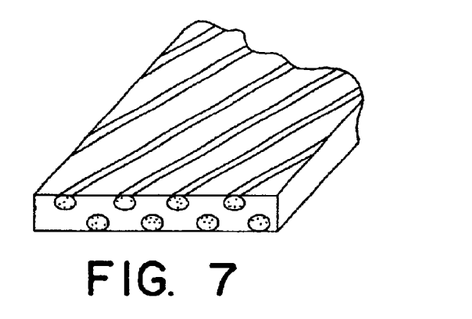
Figure 9:
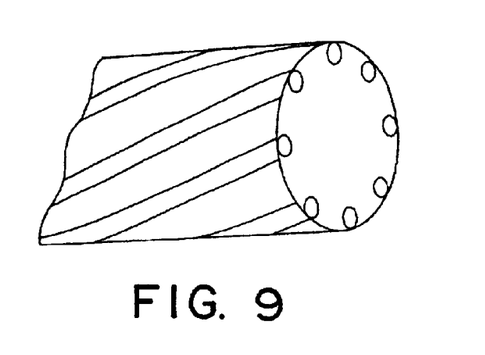

In FIGS. 7 and 9, the Cu—Nb composites are carried in grooves of a carrier element resistant to the leach, but sufficiently confining to constrain the Cu free Nb filaments.

Figure 8:
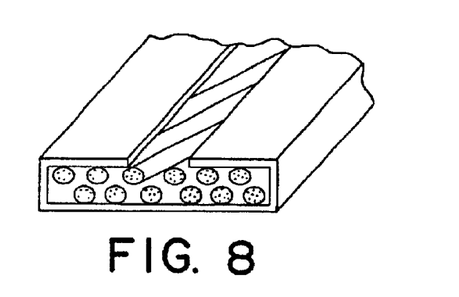

In FIG. 8, a Cu—Nb cable is twisted and flattened and then partially surrounded by a constraining layer.

In all cases, the principal requirements of the constraining layer are to allow for sufficient porosity for copper removal by acid, to be resistant to nitric acid attack, to constrain and support the loose Nb filaments after Cu removal and for subsequent infiltration with Sn. The constraining metal must be one which will not react with Sn or, if Nb is used will be sufficiently thick so that it will not be all converted to $Nb_3Sn$.

Transition metal carbides and nitrides such as NbN and NbC occur with the B1 (NACL) crystal structure. Niobium nitride has been shown to have a transition temperature approaching 19°K. These important compounds are described in "*Treatise on Material Science and Technology*", Vol. 14, Metallurgy of Superconducting Materials, 1979 edited by Thomas Luhman and David Dew-Hughes, pages 429–432.

The present invention can be employed for forming NbN. Exactly the same steps are utilized, that of porous outer sheath surrounding a copper matrix with Nb filaments from which the copper matrix is removed. Instead of the Sn infiltration step, a nitrogen containing atmosphere is introduced in which the niobium filaments are converted into niobium nitride (NbN) at elevated temperatures.

From a practical point of view, the gaseous phase reaction is a simpler and cleaner process than the handling of liquid Sn in the temperature range of 1000° C. The NbN filaments can be used as reacted or may require a metal infiltration for improved stability reasons as described by L. T. Summers, J. R. Miller, "The Influence of Liquid Metal Infiltration on Superconducting Characteristics of Niobium Nitride," Advanced in Cryogenic Eng., Vol. 34, pp. 835–842, 1987.

Figure 1A:
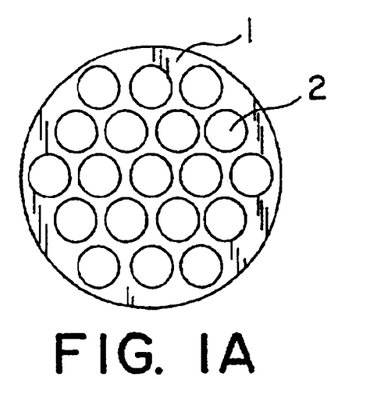
Figure 1B:
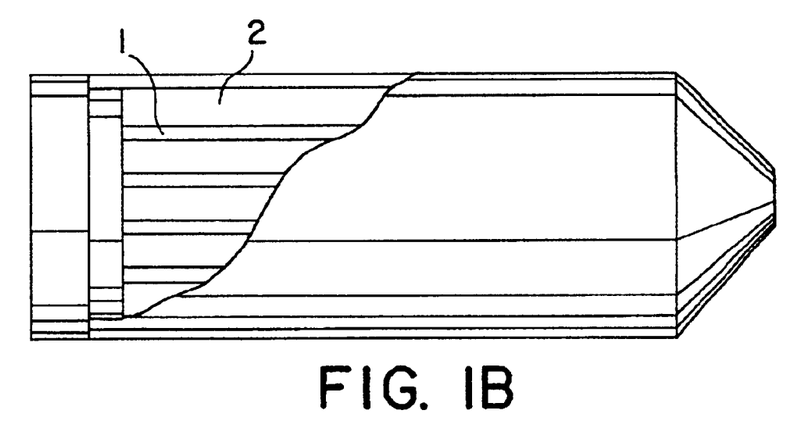

EXAMPLE I 19 holes 2 are drilled into a 15.3 cm diameter bar 1 of copper 63.5 cm long 1 as shown in FIG. 1a. The holes are 2.57 cm in diameter and run the length of the bar in parallel fashion. The pattern of holes is as shown in FIG. 1a. The shortest distance between any two holes is 5.08 mm. A 1.27 cm insert is machined into each end of the copper bar. The insets are necessary in order that a copper nose and tail may be attached later. The copper bar containing the holes, a copper nose, and a copper tail are etched clean in a nitric acid solution, they are rinsed in water, rinsed a second time in methanol, and are then dried. 19 niobium bars, 2.54 cm in diameter and 61 cm long 2 are wiped clean with acetone and are inserted into the holes in the copper bar 3. The nose and tail are tungsten inert gas (TIG) welded into place, and the billet is evacuated at a temperature of 427° C. to a pressure of $10^{-6}$ torr. The billet is then sealed as shown in FIG. 1b.

In preparation for extrusion, the billet is heated at a temperature of 816° C. for a period of three hours. The billet is then extruded to a diameter of 2.54 cm. The extruded rod is cropped to ensure uniformity, and the cropped rod is cold drawn at an areal reduction rate of 20% per die pass to a final hexagonal diameter of 3.48 mm. That is, the final wire shape is hexagonal and the distance from flat to flat across the hexagon is 3.48 mm. At this size, the niobium filament diameter is 0.61 mm.

The wire is straightened and cut to 61 cm lengths. Pure copper rod is drawn to 3.48 mm diameter hexagonal wire and is straightened and cut to 61 cm lengths in the same manner as the wire containing the Nb filaments. Both types of filaments are cleaned in nitric acid in the same manner as was the primary billet. 1045 of the Nb-containing filaments 4 are stacked in symmetrical fashion.

A section of 0.64 mm thick Nb sheer 7, 45.7 cm wide and 610 cm long, is wiped clean with acetone and is inserted circumferentially into a clean copper can 8 having an internal diameter 14.5 cm, an external diameter 16.5 cm, and a length of 63.5 cm 7. The sheet 7 overlays by 0.3 cm so as to ensure a continuous layer. The long dimension of the sheet runs along the can length. The stack of filaments is inserted into the niobium-lined can (see FIG. 2) and the copper nose and tail are electron beam welded into place under a vacuum of $10^{-4}$ torr. The billet is then hot isostatically pressed at a pressure of 104 Mpa and temperature of 650° C. for four hours. The isostatically pressed billet is machined to a diameter of 15.3 cm, and the billet is prepared for extrusion by heating for three hours at 816° C. The billet is then extruded to a diameter of 2.54 cm.

The extruded rod is cropped to ensure uniformity. It is then drawn at an areal reduction rate of 20% per die pass to a diameter of 1.02 mm and twisted. At this wire diameter, the diameter of the Nb filaments is 4.06 microns, and the thickness of the niobium sheath is 42.6 microns. The total volume fraction of Nb filaments within the Nb sheath is 34.9%.

Thereafter, the Nb outer sheath 7 is perforated by means such as slotted rolls as mentioned previously and the product is leached in $HNO_3/H_2O$ at 100° C. for 60 min. to remove the copper separating the Nb filaments. The copper-free mass of Nb filaments is then preferably immersed in a tin bath at 1100° C. to allow for maximum fluidity and surface tension of the Sn bath. An inert atmosphere of Argon is used to avoid oxidation. Dipping resident time in the Sn bath should be as short as possible (less than 10 sec) to minimize $Nb_3Sn$ formation at this stage and maximize the ductility for further processing; i.e. cabling.

EXAMPLE II

In Example I, a continuous sheath, as shown in FIG. 2, was employed and at the final size the conductor was mechanically perforated as shown in FIGS. 3a and 3b to allow for the removal of the copper matrix by acid leaching followed by liquid tin infiltration at high temperatures. It was also shown that the sheath can be applied separately after the conductor has been fabricated by means of taping FIG. 5, braiding FIG. 6, or by mechanically confining the conductor into a support structure as shown in FIGS. 7, 8 and 9.

A simpler and considerably less expensive method has been found which accomplishes the same objective. The sheath is constructed exactly as in Example I except now a narrow opening is left which is parallel to and runs the length of the filaments shown in FIG. 10.

The size of the opening can be adjusted to permit rapid copper removal of the matrix by acid leaching and still retain the sheath's ability to constrain and support the filaments. Following the final reduction, twisting and copper removal, a product which is an exact duplicate of the taping example of FIG. 5 is remarkably produced. Several variations are possible in the sheath design. For example, more than one opening can be used.

The twisting action causes the outer filaments to stretch more than the inner strands and when the copper matrix is removed, the outer filaments are under tension and act to compress and constrain the inner bundle of filaments. It has been observed that untwisted or lightly twisted, the outer filaments will tend to exfoliate at the sheath opening.

This conductor was leached in a $HNO_3/H_2O$ 50/50 acid solution at 100° C. to completely remove the copper matrix. The following Cu—Sn alloys were then used for infiltration experiments:

| Cu wt % | Sn wt % |
|---------|---------|
| 87 | 13 |
| 67 | 33 |
| 50 | 50 |
| 25 | 75 |
| 20 | 80 |
| 10 | 90 |
| 0 | 100 |

Successful infiltration at 1000° C. was obtained for all alloys with the exception of the 13 wt % Sn alloy. This alloy has a liquidus temperature of 1000° C. and would have required a temperature of at least 1200° C. which was beyond the temperature capability of our small laboratory furnace.

The 33 wt % Sn alloy sample was subsequently heat treated at 675° C. for 24 and 48 hours. Metallographic examination of the cross section for the 48 hour sample reveals a substantial $Nb_3Sn$ reacted layer, averaging 4–6 micron in thickness both in the filaments and in the surrounding sheath.

As shown in FIG. 4, a central copper core can be used. As a typical requirement, up to 40 wt % copper is needed to insure stable conductor performance. To prevent Sn contamination of the copper core, a Ta protective barrier is employed in FIG. 4. It should be recognized that this structure by itself contributes a significant amount of support and that together with the external sheath of this invention would combine to protect the fragile $Nb_3Sn$ filaments inside. It has been shown that a high strength copper containing Nb composite has been successfully used in conjunction with $Nb_3Sn$ conductors and can be used in place of pure copper. (See Advances in Cryogenic Eng., Vol. 42, Plenum Press, N.Y. 1996, pages 1423–1432).

EXAMPLE III

Figure 10:
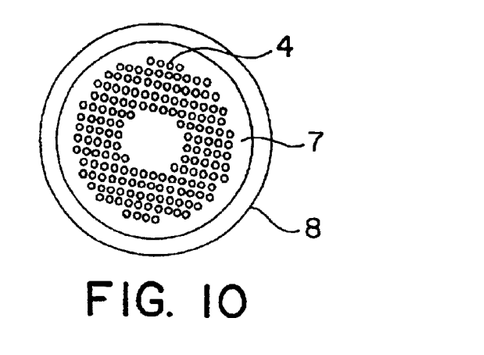
FIG. 10 is a schematic depiction of the primary billet used in the preferred embodiment of the present invention.
Figure 11:
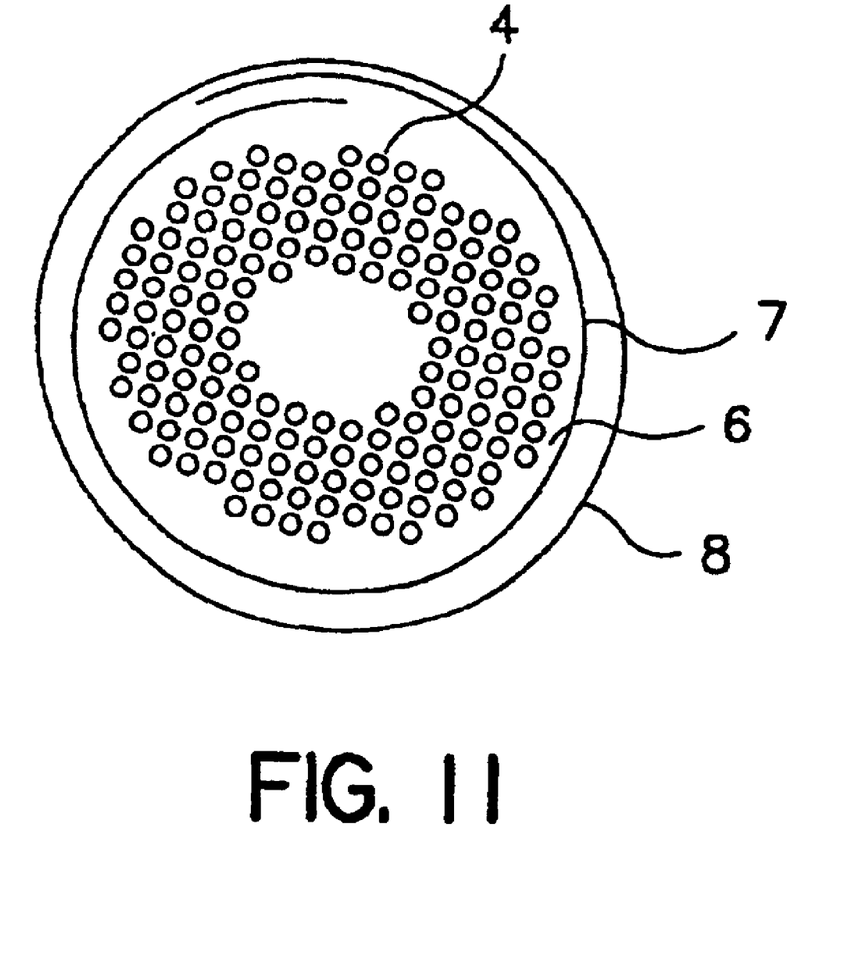
FIG. 11 shows an over lapping design of confining layer.

The open sheath design shown in FIG. 10, while improving the acid leaching of the Copper matrix can leave an open gap on the surface of the wire after dipping. In this condition, on bending especially in the twisted condition, breaks can occur. An overlapping design, shown in FIG. 11 essentially overcomes this difficulty. The overlap design provides a smooth continuous sheath on the surface of the wire and in addition provides added support at the opening. When sufficient thickness and depth of the openings are provided, little differences in the rate of copper removal were observed. In Example III, an opening of 0.05 mm×1.00 mm was used. Furthermore, this design insures that all the filaments are completely enclosed within the sheath and eliminates any possibility of filament escape.

Test samples were drawn to 1.00 mm and 0.762 mm diameter. The copper matrix was removed and dipped in a Cu-33 wt % Sn bath at 1100° C. The total resident time in the CuSn bath was 10 seconds. It was then reacted for 50 hours @ 690° C. in an Argon atmosphere furnace. The samples were then tested at 4.2°K in a perpendicular magnetic field of 9 and 8 Tesla:

| Sample No. | Size | 9T | 8T |
|------------|------|-----|-----|
| 5006-4B | 1.00 mm | >120[a] | >120[a] |
| 5006-4B | 0.762 mm | 102[a] | 108[a] |

The $J_c$ calculation based on the original Nb area prior to reaction equals 1666 A/mm$^2$ @ 9 Tesla.

The ductility of samples processed with increasing Sn concentration were examined. While the higher wt % Sn sample gave excellent $Nb_3Sn$ thickness values, they were also brittle and this could compromise further processing of the wire. It's important to point out that this brittleness is not caused by the Nb filaments but is entirely due to the brittle CuSn compound.

Indirect evidence of matrix ductility was observed during the machining of the CuSn alloys from the used crucible. Normal procedures allow the CuSn to furnace cool. It was found that all the high Sn alloys were brittle, with the sole exception of the Cu-23 to 25 wt % Sn alloy. Continuous ductile chips were obtained. The reason can be seen from the CuSn phase diagram. Below 350° C., a significant amount (~40%) of ductile α phase compound is formed and is in equilibrium with the ε compound phase.

A series of water quench experiments were carried out with the Cu-23, 25, 27, 33 and 38 wt % Sn samples. These samples were quickly removed from the dipping furnace and water quenched. Bend test showed brittle behavior for all the Sn alloys except for the 23 to 25 wt % Sn alloy. It could, remarkably be bent around a ¼" diameter mandrel without fracture. For this reason, Cu-23 to 25 wt % Sn based alloy was selected for most of the matrix alloy studies.

To increase the Nb filament packing, the leached precursor wire, which measured 0.914 mm diameter, was further twisted and compacted to a diameter of 0.813 mm. The overall reduction in area was 20.9% and thus resulted in a proportional increase in the overall non-copper current density of the wire. Additionally, as the wire is drawn through the molten metal bath, the twisted sheath tightens and further compresses and constrains the filament bundle.

EXAMPLE IV

In this invention, the ability to fully utilize alloying additions both to the Nb filaments and to the matrix without the mechanical co-processing limitations of the existing processes offer unique opportunities to further enhance the performance of these brittle A-15 compound conductors. In addition to the references cited earlier, more recent references are included and summarize the results of three decades of continuous effort, which is still ongoing today. Of specific interest are: Tachikawa, "Filamentary A-15 Superconductors" by Masaki Suenaga and Alan F. Clark, Plenum Press, N.Y., Cryogenic Mat. Series 1980 Page 1–12. Tachikawa, et al U.S. Pat. No. 4,224,087, Flukiger, et al U.S. Pat. No. 4,746,581, and Sakamoto, et al "Very High Critical Current Density of Bronze-processed (Nb, Ti)3 Sn Superconducting Wire." IEEE Transaction, ASC volume 10, No. 1, March, 2000.

The following Nb alloys were studied; Nb-1 wt % Zr, Nb-1.8 wt % Ti, Nb-7.5 wt % Ta, and Nb-10 wt % Hf-1 wt % Ti (C-103 Wah Chang). It is important to note that all of these are commercially available; the Nb-1.8 wt % Ti and Nb-7.5 wt % Ta having been specifically developed for the superconductivity market. The Nb—Hf alloy however was not, having been developed almost four decades ago for aerospace applications. It would be extremely fortuitous, of great practical and commercial value, if alloy C-103 can be used in this invention, especially considering the time and expense normally required for such a task.

Figure 12:
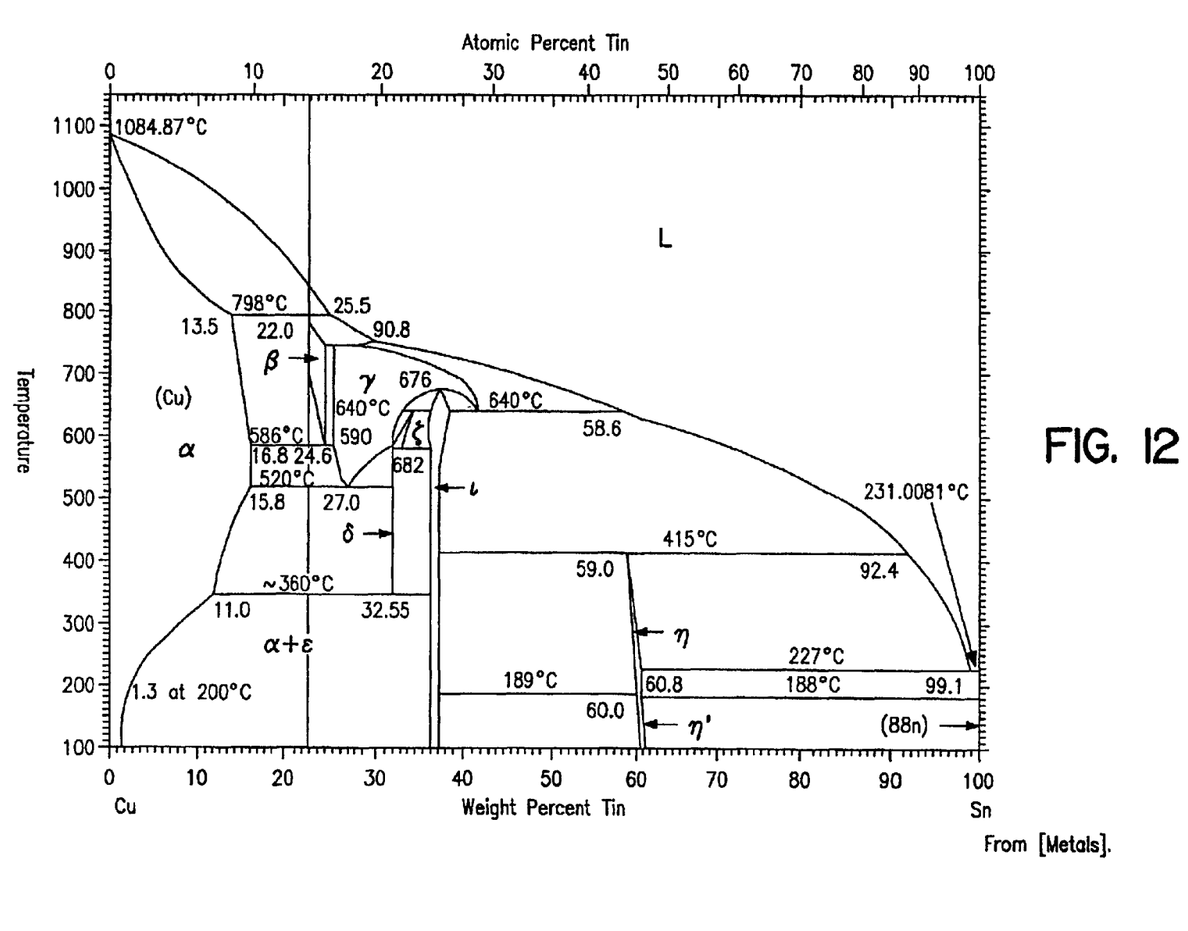
FIG. 12 is a Cu—Sn phase diagram.
Figure 13:
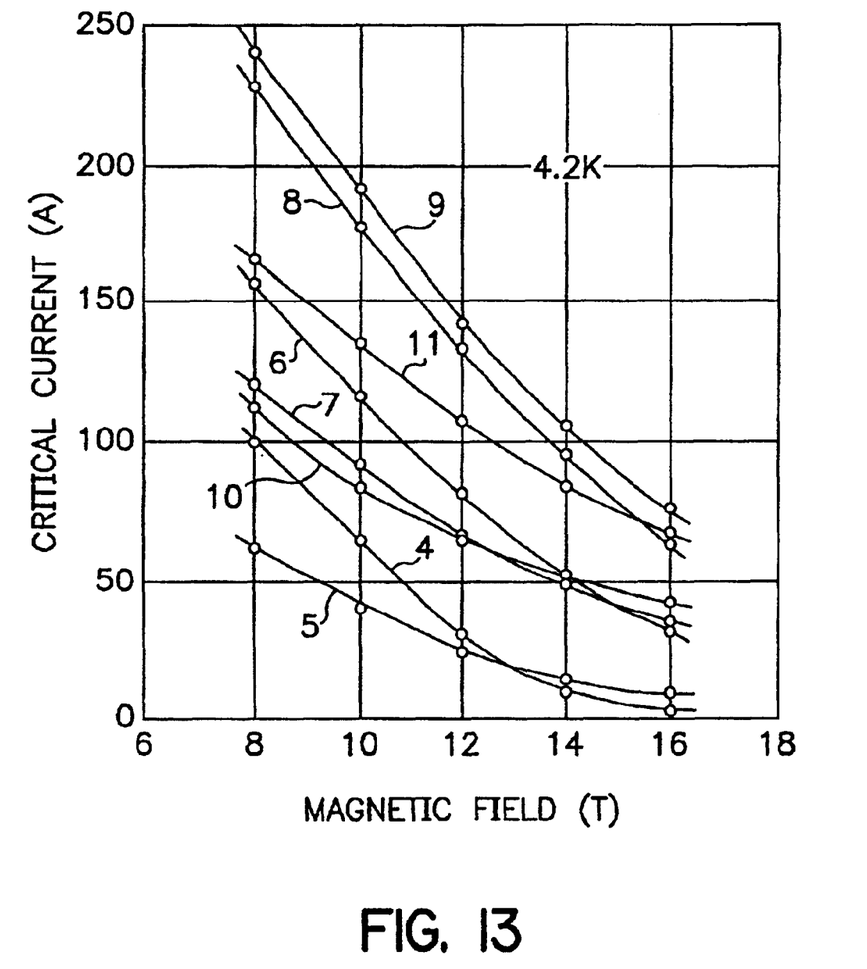
FIG. 13 shows the relationship between magnetic field and critical current for a number of different superconducting alloys. This is taken from U.S. Pat. No. 4,224,087.
Figure 14:
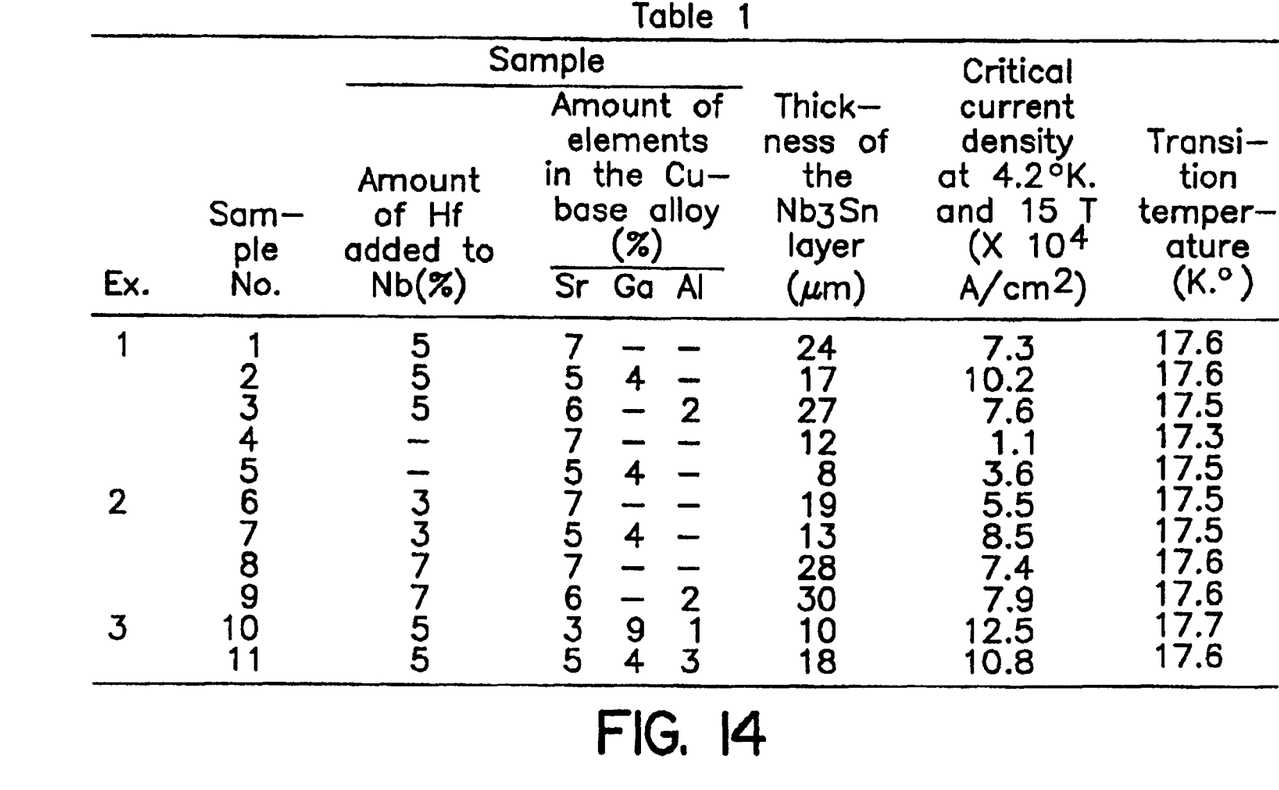
FIG. 14 shows the thickness of the $Nb_3$ Sn layer as a function of Hf additions to the base Nb. This is also taken from U.S. Pat. No. 4,224,087.

Of particular relevance is Tachikawa '087 where in FIG. 7 and Table 1, (our FIG. 12 and FIG. 13) clearly shows current increases at 12 Tesla of over 4 times and $Nb_3Sn$ thickness layers of more than 2 times in the Hf alloyed Nb as compared to pure Nb. In addition, in his publication, he reported that no degradation occurs until the mechanical strain exceeds 1% as compared to 0.7 without Hf additions.

Martin, et al '032 and more recently, Rumaner and Benz, "Effects of Oxygen and Zirconium on the Growth and Superconducting Properties of Nb₃Sn". Met. and Mat., Trans. A, Vol. 25A, January 1994, P. 203–212 describes the flux pinning role of oxygen and zirconium in the Nb-1 wt % Zr alloy. In this invention, the same mechanism can be employed. In my aforesaid U.S. Pat. No. 5,869,196, I describe the need to deoxidize the fine Ta filaments intended for capacitor applications. The filament sizes of interest were 1 micron and less. As the filaments are reduced in size the surface area of the filament increases as the reciprocal (1/D) of the diameter. This would suggest that when smaller filaments are used, the surface area and thus also the oxygen on the surface of the filament would also increase. During the leaching step, a strong 50/50 $HNO_3/H_2O$ solution, heated to 100° C. is used. Substantial amount of surface oxygen can be generated. This oxygen can then be combined with zirconium as described by Martin and Rumaner and Benz for flux pinning.

The benefits of using Nb alloys such as Nb 1 wt % Zr, Nb 1.8 wt % Ti, Nb 7.5 wt % Ta, and Nb-10Hf-1 wt % Ti were confirmed in our studies. Substantial increase in $Nb_3Sn$ layer thickness compared to pure Nb were seen in all cases. The increases for Nb-10Hf-1 wt % Ti was by far the greatest, confirming the results of Tachikawa. The following samples were dipped in a Cu-23 wt. % Sn bath at 1100° C. and reacted for 100 hours at 690° C.

| Nb Alloy | Nb₃ Sn Thickness (Microns) |
| --- | --- |
| Nb | 2–4 |
| Nb-1 wt % Zr | 6–8 |
| Nb-1.8 wt % Ti | 6–8 |
| Nb-7.5 wt % Ta | 4–6 |
| Nb-10 wt % Hf-1 wt % Ti | 10–12 |

Nb 1 wt % Zr appears to react as well as Nb 1.8 wt % Ti. This should not be surprising since Ti and Zr are very similar metals and would be expected to function in a similar manner.

The CuSn matrix alloys studied were: Cu-19 Sn-0.37 Ti, Cu-23 Sn-0.25 to 4 wt % Ti, and Cu-23 Sn-0.5 to 2 wt % Mg. It was observed that any increase of over 2 wt % Ti and Mg resulted in incomplete infiltration. It was surprising that this would occur at this level of alloy addition and must be related to changes in the surface tension of the bath and its limited solubility, even at 1100° C. Further, it was found that alloys with less than 0.5 wt % Ti were equally effective in promoting $Nb_3Sn$ growth. This should be expected since the $Nb_3Sn$ is reacted is at 700° C.±50° C. and the solubility limits for Ti and Mg are lower at lower temperatures. For these reasons, the preferred alloy matrix composition should be between 15 to 25 wt % Sn plus 0.2 to 2.0 wt % Ti, balance copper.

A significant discovery, which was not anticipated, was the apparent complete absence of Kirkendall voids from all the reacted samples. This is in stark contrast to similarly reacted samples of commercial internal Sn conductors as described in a paper by M. Naus, et al, "The Interdiffusion of Cu and Sn in Internal Sn $Nb_3Sn$ Superconductors", IEEE Transaction ASC Volume 10(1) 983–987, 2000. The major source of Kirkendall voids, which occurs even before the $Nb_3Sn$ reaction starts, is the direct result of the Cu and Sn diffusion process.

Because of the absences of these defects, it is expected that the product of this invention would be superior mechanically compared to internal Sn conductors and would be more resistant to degradation, from cabling, compacting and other externally applied stresses.

EXAMPLE V

The previous examples describe removal of the original copper matrix by acid leaching followed by a high temperature liquid Cu/Sn impregnation step. This example provides an alternate method for removal of the original copper matrix.

This example starts with the premise that it would not be necessary to remove the original copper matrix if a satisfactory way can be found to add Sn to the copper; typically between the 13% and 40 wt % range. Assurance of complete copper removal is difficult and time consuming. Moreover, hot acid removal can result in surface oxygen and nitrogen contamination as well as left over residue copper nitrates, all of which can reduce wetting and successful impregnation.

Figure 15A:
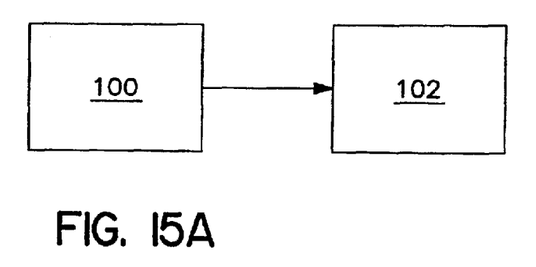
FIGS. 15a and 15b are block flow diagrams depicting an alternative fabrication method in accordance with the present invention.

It has been observed that when a copper rod is inserted into an Sn bath at 1100° C., the copper rod dissolved essentially instantly. Based on this observation, it was postulated that this essentially instantaneous dissolving could occur also with the copper matrix and in effect replace the copper with an Sn matrix. To limit the % Sn to the desired 13–40 wt % range, a Cu—Sn alloy could be used in place of pure Sn. Increasing copper would be expected to slow the alloying process so it was important to establish the limits of both bath composition and time. Referring to FIG. 15a, in accordance with this Example V, samples of billets taken in the as drawn unetched condition 100 were immersed in a pure Sn bath 102 at 1100° C. for 2, 4, 6, and 8 minutes. The wire diameter was 1 mm with the billet containing 2,508 8 micron Nb filaments.

Complete Sn penetration was observed even for the 2-minute sample. Duplicate samples were held in a Cu-25 wt % Sn bath for 5, 10 and 15 minutes. Limited Sn diffusion was observed even for the 15 minute samples. The Sn was limited to the open gap region of the sheath. The extend of the Sn diffusion can be seen by the $Nb_3Sn$ that forms on each filament when Sn is present in sufficient quantities. Higher temperature improves Sn diffusion simply by increasing the liquidity and mixing between the Cu—Sn bath and copper matrix.

Figure 15B:
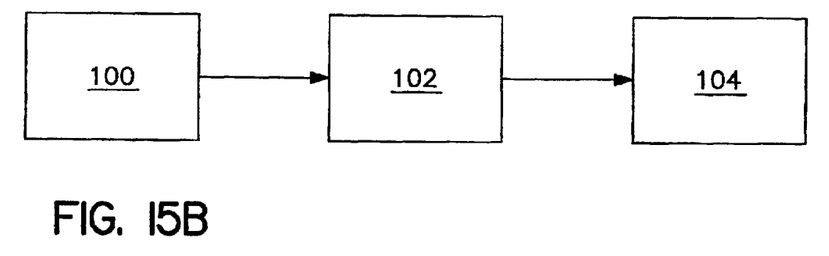

Referring to FIG. 15b, in a preferred embodiment of this alternative process of this invention, a two-step dipping process is used: samples of billets 100 are subjected to a first dip 102 in a pure Sn bath at 1100° C. followed by a dip in a Cu-25 wt % Sn bath 104 at 1100° C. In both cases, the high liquidity of the Sn is utilized to replace the copper matrix to Sn and for the reintroduction of a fixed quantity of Cu back into the matrix.

Previous samples of the pure Sn dip for 2, 4, 6 and 8 minutes were redipped a second time for 2, 4, 6 and 8 minutes.

| Sample | Pure Sn | Cu-25Sn |
| --- | --- | --- |
| 1 | 2 | 2 |
| 2 | 4 | 4 |
| 3 | 6 | 6 |
| 4 | 8 | 8 |

Successful impregnation was observed in all cases.

In a surprising discovery, using this two step process, the original filament pattern was essentially retained. In the case where the copper matrix was acid removed and impregnated with a CuSn alloy, the filaments appear to agglomerate in a random fashion. The reason for this retention is probably due to the initial formation of a CuSn two phase liquid/semi-solid state which would tend to hold the filaments on place.

Ti, Mg and other alloying elements also may be included in second bath. The advantage of adding Ti, Mg and other alloying elements are detailed in Example IV. The difficulties of adding these elements are now eliminated since during the first dip in a pure tin bath, maximum liquidity are still maintained.

The examples given above are illustrative in nature only and variation in composition, temperature and time should be recognized and included in the scope of this invention.

What is claimed:

1. A process for manufacturing a $Nb_3Sn$ superconductor comprising the steps of establishing multiple niobium components in a billet of a ductile metal, working the composite billet through a series of reduction steps to form said niobium components into elongated elements, each said element having a thickness on the order of 1 to 25 microns, surrounding said billet with a porous confining layer of an acid resistant metal, immersing said confined billet in an acid to remove said ductile metal from between the niobium elements while the niobium elements remain confined by said porous layer, immersing the confined mass of niobium elements in a liquid metal containing tin to coat said niobium elements with said liquid metal and subsequently reacting said tin with the Nb filaments to form $Nb_3Sn$, the liquid metal being a copper alloy containing up to 95 wt % Sn and at least 13 wt % Sn.

2. The process of claim 1, wherein the metal bath contains about 23 to 25 wt % Sn.

3. The process of claim 1, wherein the liquid metal coated niobium is rapidly quenched after removal from the metal bath.

4. The process of claim 1, wherein the liquid metal bath contains 0.2 to 2.0 wt % Ti.

5. The process of claim 1, wherein the Nb component contains at least one metal from the group consisting of Zr, Ti, Ta and Hf.

6. The process of claim 5, wherein the Nb component is Nb-1 wt % Zr.

7. The process of claim 5, wherein the Nb component is Nb-1.8 wt % Ti.

8. The process of claim 5, wherein the Nb component is Nb-10 wt % Hf-1 wt % Ti.

9. The process of claim 5, wherein the Nb component is Nb-7.5 wt % Ta.

10. A process for manufacturing a $Nb_3Sn$ superconductor comprising the steps of establishing multiple niobium components in a billet of a ductile metal, working the composite billet through a series of reduction steps to form said niobium components into elongated elements, each said element having a thickness on the order of 1 to 25 microns, surrounding said billet with a porous confining layer, immersing said confined billet in a liquid metal bath comprising a metal or metal alloy capable of alloying with the ductile metal whereby to replace said ductile metal from between the said niobium elements with an alloy of said ductile metal and said alloying metal, reacting said tin or tin alloy with the Nb filaments to form $Nb_3Sn$.

11. The process of claim 10, wherein the liquid metal bath comprises tin, aluminum or an alloy of tin or aluminum.

12. The process of claim 10, wherein the liquid metal bath comprises a tin-copper alloy.

13. The process of claim 11, wherein the liquid metal bath comprises about 23 to 25 wt % tin.

14. The process of claim 10, wherein the liquid metal bath comprises pure tin.

15. The process of claim 10, wherein the liquid metal bath also contains at least one metal selected from the group consisting of Zr, Ti, Ta, Mg and Hf.

16. The process of claim 15, wherein the liquid metal bath contains 1 wt % Zr.

17. The process of claim 15, wherein the liquid metal bath contains 1.8 wt % Ti.

18. The process of claim 15, wherein the liquid metal bath contains 10 wt % Hf and 1 wt % Ti.

19. The process of claim 15, wherein the liquid metal bath contains 7.5 wt % Ta.

20. The process of claim 10, wherein the liquid metal bath is heated to a temperature of 700 to 1400° C.

21. The process of claim 20, wherein the liquid metal bath is heated to a temperature of 1000 to 1200° C.

22. The process of claim 20, wherein the liquid metal bath is heated to a temperature of about 1100° C.

* * * * *